United States Patent [19]

Hori

[11] 4,147,534
[45] Apr. 3, 1979

[54] METHOD FOR OBTAINING Mg AND Ca THROUGH CARBON REDUCTION

[76] Inventor: Fumio Hori, 23, 15ban,, Kentanicho, Nishinomiyashi, Hyoken, Japan

[21] Appl. No.: 824,081

[22] Filed: Aug. 12, 1977

[30] Foreign Application Priority Data

Aug. 16, 1976 [JP] Japan .................................. 51-98012

[51] Int. Cl.² ........................ C22B 29/00; C22B 35/00
[52] U.S. Cl. ................................... 75/67 R; 75/10 A; 75/84;; 55/17; 55/72
[58] Field of Search .................. 75/10 A, 67 R, 67 A, 75/84; 266/148; 55/72, 17

[56] References Cited

U.S. PATENT DOCUMENTS

| | | | |
|---|---|---|---|
| 1,762,716 | 6/1930 | Grine | 75/88 |
| 2,032,215 | 2/1936 | Kemmer | 75/67 |
| 2,257,910 | 10/1941 | Kirk | 75/67 |
| 3,626,665 | 12/1971 | Fenn et al. | 55/17 |

FOREIGN PATENT DOCUMENTS

794834  5/1958  United Kingdom.

*Primary Examiner*—M. J. Andrews
*Attorney, Agent, or Firm*—Eyre, Mann, Lucas & Just

[57] ABSTRACT

The invention provides methods and apparatus for the production of Mg and Ca through a carbon reduction of their oxides, wherein Mg (or Ca) and CO co-existing in the mixed gas produced from said carbon reduction are kept safe from their reaction into MgO (or CaO) and C throughout the whole process until they are effectively separated for collection.

5 Claims, 16 Drawing Figures

| | | | | | | | | | | | | | | | |
|---|---|---|---|---|---|---|---|---|---|---|---|---|---|---|---|
| ☐ VALVE OPENED, VACUUM PUMP OPERATED, CONVEYOR ROTATED IN NORMAL DIRECTION, HEATER TURNED ON. | | | | | | | | | | | | | | | |
| ▨ VALVE CLOSED, VACUUM PUMP STOPPED, CONVEYOR ROTATED IN REVERSE DIRECTION, HEATER TURNED OFF. | | | | | | | | | | | | | | | |

| ITEMS | TIME |
|---|---|
| HEATER 21 | CONTINUOUS OPERATION |
| HEATER 30 | WITH BREAKS UNDER THERMAL CONTROL |
| VACUUM PUMP 43 | CONTINUOUS OPERATION |
| HEATER 37 | WITH BREAKS UNDER THERMAL CONTROL |

| | ITEMS | a | b | c | d | e | f | SAME SEQUENCE FOLLOWS |
|---|---|---|---|---|---|---|---|---|
| MATERIAL TANK 14 | VALVE 16 | | | | | | | |
| | VALVE 15 | | | | | | | |
| | VALVE 19 | | | | | | | |
| | VALVE 20 | | | | | | | |
| | VACUUM PUMP 18 | | | | | | | |

| | ITEMS | g | h | i | j | k | l | SAME SEQUENCE FOLLOWS |
|---|---|---|---|---|---|---|---|---|
| RESIDUE RESERVOIR 8 | VALVE 6 | | | | | | | |
| | VALVE 7 | | | | | | | |
| | VALVE 11 | | | | | | | |
| | VALVE 12 | | | | | | | |
| | VACUUM PUMP 10 | | | | | | | |

| | | ITEMS | n | o | p | q | r | s | t | u | v | w | x | y | z | |
|---|---|---|---|---|---|---|---|---|---|---|---|---|---|---|---|---|
| MELTING FURNACE 48 | LEFT HAND | VALVE 47 | | | | | | | | | | | | | | |
| | | VALVE 47' | | | | | | | | | | | | | | |
| | | VALVE 53 | | | | | | | | | | | | | | |
| | | VALVE 54 | | | | | | | | | | | | | | |
| | | VACUUM PUMP 52 | | | | | | | | | | | | | | |
| | | HEATER 50 | | | | | | | | | | | | | | |
| | | CONVEYOR 44 | | | | | | | | | | | | | | |
| | | ITEMS | a' | b' | c' | d' | e' | f' | g' | h' | i' | j' | k' | l' | m' |
| | RIGHT HAND | VALVE 47 | | | | | | | | | | | | | | |
| | | VALVE 47' | | | | | | | | | | | | | | |
| | | VALVE 53' | | | | | | | | | | | | | | |
| | | VALVE 54' | | | | | | | | | | | | | | |
| | | VACUUM PUMP 52' | | | | | | | | | | | | | | |
| | | HEATER 50' | | | | | | | | | | | | | | |

FIG. 6A.

a: MATERIAL SUPPLIED INTO TANK
b: VACUUM PRODUCED
c: INERT GAS INTRODUCED
d: MATERIAL SHIFTED INTO REACTION CHAMBER
e: AIR INTRODUCED
f: MATERIAL SUPPLIED INTO TANK g: VACUUM PRODUCED
h: INERT GAS INTRODUCED
i: RESIDUE DROPPED INTO RESERVOIR
j: INERT GAS INTRODUCED
k: RESIDUE RECEIVED IN RECEPTABLE
l: VACUUM PRODUCED n: Mg PARTICLES SUPPLIED INTO FURNACE
o: INERT GAS INTRODUCED
p: MELTING
q: MOLTEN PRODUCT SUPPLIED INTO RESERVOIR
r: VACUUM PRODUCED
s: INERT GAS INTRODUCED
t: Mg PARTICLES SUPPLIED INTO FURNACE
u: ″    ″    ″    ″    ″
v: ″    ″    ″    ″    ″
w: ″    ″    ″    ″    ″
x: ″    ″    ″    ″    ″
y: INERT GAS INTRODUCED
z: MELTING $a^l$: INERT GAS INTRODUCED
$b^l$: Mg PARTICLES SUPPLIED INTO FURNACE
$c^l$: ″    ″    ″    ″    ″
$d^l$: ″    ″    ″    ″    ″
$e^l$: ″    ″    ″    ″    ″
$f^l$: ″    ″    ″    ″    ″
$g^l$: INERT GAS INTRODUCED
$h^l$: MELTING
$i^l$: MOLTEN PRODUCT SUPPLIED INTO RESERVOIR
$j^l$: VACUUM PRODUCED
$k^l$: INERT GAS INTRODUCED
$l^l$: Mg PARTICLES SUPPLIED INTO FURNACE
$m^l$: ″    ″    ″    ″    ″

METHOD FOR OBTAINING MG AND CA THROUGH CARBON REDUCTION

The present invention relates to methods and apparatus for obtaining Mg and Ca in their metallic, pure form from their oxides or a material containing the same. More specifically, the present invention is directed to the production of Mg and Ca, wherein a mixed gas of Mg (or Ca) and CO gases is initially produced by a carbon reduction of its oxides at an elevated temperature, and wherein the mixed gas is then ejected at a supersonic speed through a divergent nozzle operated under the condition of underexpansion, under the thermal control by which the undesired reverse reaction of Mg (or Ca) with CO is effectively avoided, thereby enabling the mixed gas to separate into Mg (or Ca) and CO in a collectable form.

The conventional method for obtaining metallic Mg and Ca is a carbon reduction at an elevated temperature, which is expressed by the following reaction formula:

In this reaction, when the material is heated to about 2000° C. at atmospheric pressure (more exactly, about 1800° C. for MgO and about 2050° C. for CaO) the reaction advances in the right-hand direction, and produces a mixed gas of Mg (or Ca) and CO. However, if the temperature lowers below about 1800° C. or about 2050° C. at atmospheric pressure, the reaction occurs radically in the left-hand direction, thereby causing the mixed gas to dissociate into MgO and C (or CaO and C). Accordingly, in order to obtain Mg and Ca in its metallic form by the condensation of Mg (or Ca) vapour to separate it from the CO gas, it is also required to cool the mixed gas instantaneously to about 400° C. or below to prevent the reverse reaction from ocurring. It is preferred that the temperature is lowered 200° C. at which Mg (or Ca) and CO cannot react with each other or react only at a negligible speed. In the range of the effective temperatures for the reverse reaction it occurs extremely quickly (though it depends upon the pressure), and therefore it is essential to pass this dangerous thermal zone instantly without a moment for which the undesired reverse reaction occurs. This necessitates that the mixed gas should be completely and rapidly cooled. Whether or not it succeeds in it is a key to the process of obtaining Mg and Ca in its metallic form.

Accordingly, there have been many proposals for the instantaneous cooling, one of which is to use a gaseous cooling medium not reactive with Mg, such as $H_2$, hydrocarbons, Ar, which readily admixes with the mixed gas produced through the carbon reduction to effect the instantaneous cooling thereof. Another is to use a liquid cooling medium, such as liquid hydrocarbons, a molten lead or tin, a dissolved salt, which is sprayed into the mixed gas to cool it by the latent heat of vapouring. A further proposal is to use a solid cooling medium of salts, such as magnesium chloride, which is ejected in a powder form into the mixed gas, singly or with the addition of another cooling medium, liquid or gaseous, such as $H_2$, so that the mixed gas is cooled by the latent heat of fusing or vapourizing. However, the major disadvantage of these methods is that the cooling speed is too slow to prevent the undesired reverse reaction even if a greater amount of cooling medium is added in spite of the increased cost. This is entirely due to the fact that the cooling under these methods is made by heat exchange. The ineffectiveness of these methods was demonstrated by Permanent Plant of U.S.A. which carried out a large scale experiment in which a great amount of natural gas was used as a cooling medium. According to the report, the material was a mixture of MgO and C, which was heated to 2000° C. under normal pressure. Then the mixed gas was cooled by the cooling medium of natural gas. As a result, 50% of Mg, 20% of MgO and 30% of C were obtained.

This result shows that the insufficient cooling speed allowed the reverse reaction to occur. By these conventional methods the productivity is extremely low, and in order to ensure a high degree of purity of the product an extra process is required for perfecting the separation. However, this extra process is costly and complicated and troublesome, and after all these methods have not been adopted soon after the second world war. Since about this time Permanent Plant have given up the idea to obtain metallic Mg from Mg oxides by the conventional heat exchange system. The difficulty is due to the fact that the cooling by heat exchange cannot prevent the reverse reaction of Mg and CO, thereby tending to allow a pretty amount of MgO and C to exist in the Mg freshly obtained. This requires an additional process for refining the product.

The object of the present invention is to provide a method for obtaining active metallic Mg and Ca in a high degree of purity, without the use of any cooling medium but by the utilization of the adiabatic expansion of a mixed gas consisting of Mg or Ca vapour and CO gas, thereby eliminating any extra processes required under the known methods.

A further object of the present invention is to provide an apparatus for carrying out the above-mentioned method, so constructed as to ensure that the undesired reaction of Mg or Ca and CO is prevented throughout the whole process from the production of the mixed gas to the collection of Mg and Ca.

Other objects and advantages will become apparent from the description given hereinafter.

It will be appreciated that the present invention has paved the way for the production of Mg and Ca by the carbon reduction method which was long considered difficult for the reasons mentioned above.

According to the present invention a mixed gas of Mg (or Ca) and CO produced through a carbon reduction of its oxide is introduced into a divergent nozzle operated under the condition of underexpansion, and is ejected therethrough at a supersonic speed, during which the mixed gas is kept at temperatures at which the undesired reverse reaction is ineffective, the ejected mixed gas adiabatically expanding at a higher speed than the respective molecular motion speeds of Mg (or Ca) and CO, thereby enabling the mixed gas to cool instantaneously to a temperature at which the undesired reverse reaction is ineffective even if Mg (or Ca) and CO co-exist.

According to another aspect of the present invention a mixed gas of Mg (or Ca) and CO produced through a carbon reduction of its oxide is ejected at a supersonic speed through a divergent nozzle operated under the condition of underexpansion, and is enabled to separate into Mg (or Ca) and CO gases, each of which tends to deflect at its proper deflection angle depending upon its ratio of specific heat, thereby making it easy to collect each constituent gas.

According to a still further aspect of the present invention a mixed gas of Mg (or Ca) and CO produced through a carbon reduction of its oxide is ejected at a supersonic speed through a divergent nozzle operated under the condition of underexpansion, against a separator screen located in accordance with the deflection angle of each constituent gas, thereby facilitating the collection thereof.

For a better understanding the theory underlying the present invention will be firstly explained.

In general, the conditions under which the reaction expressed by the formula (1) occurs in the right-hand or left-hand direction are shown in TABLES 1 and 2, in which the relationship between the pressure and the equilibrium temperature in Formula (1), on the basis of thermodynamics, has been calculated and ascertained by the inventor:

TABLE 1

The pressure and the equilibrium temperature in the formula: $MgO + C \rightleftharpoons Mg + CO$:

| Pressure | | | Equilibrium Tem. | |
|---|---|---|---|---|
| atm | torr | Pmg Torr | T ° K. | T ° C. |
| 2 | 1520 | 760 | 2149 | 1876 |
| 1 | 760 | 380 | 2066 | 1793 |
| 0.5 | 380 | 190 | 1990 | 1717 |
| 0.1 | 76 | 38 | 1833 | 1560 |
| 0.05 | 38 | 19 | 1773 | 1500 |
| 0.01 | 7.6 | 3.8 | 1648 | 1375 |
| $5\times10^{-3}$ | 3.8 | 1.9 | 1600 | 1327 |
| $1\times10^{-3}$ | 0.76 | 0.38 | 1497 | 1224 |
| $5\times10^{-4}$ | 0.38 | 0.19 | 1457 | 1184 |
| $1\times10^{-4}$ | 0.076 | 0.038 | 1372 | 1099 |
| $5\times10^{-5}$ | 0.038 | 0.019 | 1339 | 1066 |

TABLE 2

The pressure and the equilibrium temperature in the formula: $CaO + C \rightleftharpoons Ca + CO$:

| Pressure | | | Equilibrium Tem. | |
|---|---|---|---|---|
| atm | torr | Pca Torr | T ° K. | T ° C. |
| 1 | 760 | 380 | 2324 | 2051 |
| 0.5 | 380 | 190 | 2236 | 1963 |
| 0.1 | 76 | 38 | 2056 | 1783 |
| 0.05 | 38 | 19 | 1987 | 1714 |
| 0.01 | 7.6 | 3.8 | 1844 | 1571 |
| $5\times10^{-3}$ | 3.8 | 1.9 | 1788 | 1515 |

In the case of Ca, unlike Mg, calcium carbide is likely to form under some conditions of temperature and pressure, which is expressed by:

$$Ca + 2C = CaC_2 \qquad (2)$$

It is essential to avoid this undesired reaction, and TABLE 3 shows an example of the conditions under which this reaction can be avoided:

TABLE 3

| Total Pressure | Temperature |
|---|---|
| 0.01atm = 7.6Torr | 2114° C. or more |
| 0.005atm = 3.8Torr | 1971° C. or more |
| 0.001atm = 0.76Torr | 1695° C. or more |

Accordingly, in the case of Ca the equilibrium temperature should be no smaller than 2000° C., and the pressure be no greater than 3.8 Torr.

Figure 10:
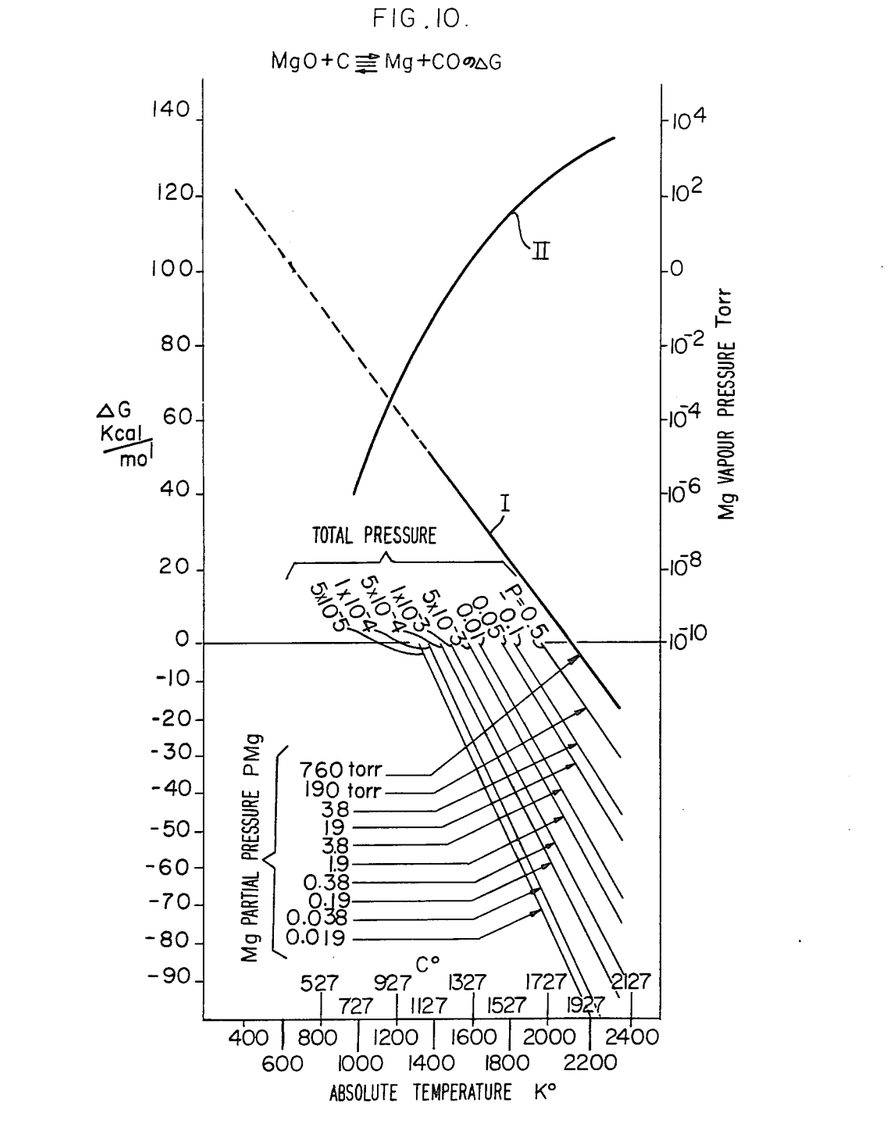
FIG. 10 is a chart showing changes in the free energy in formation of Mg.
Figure 11:
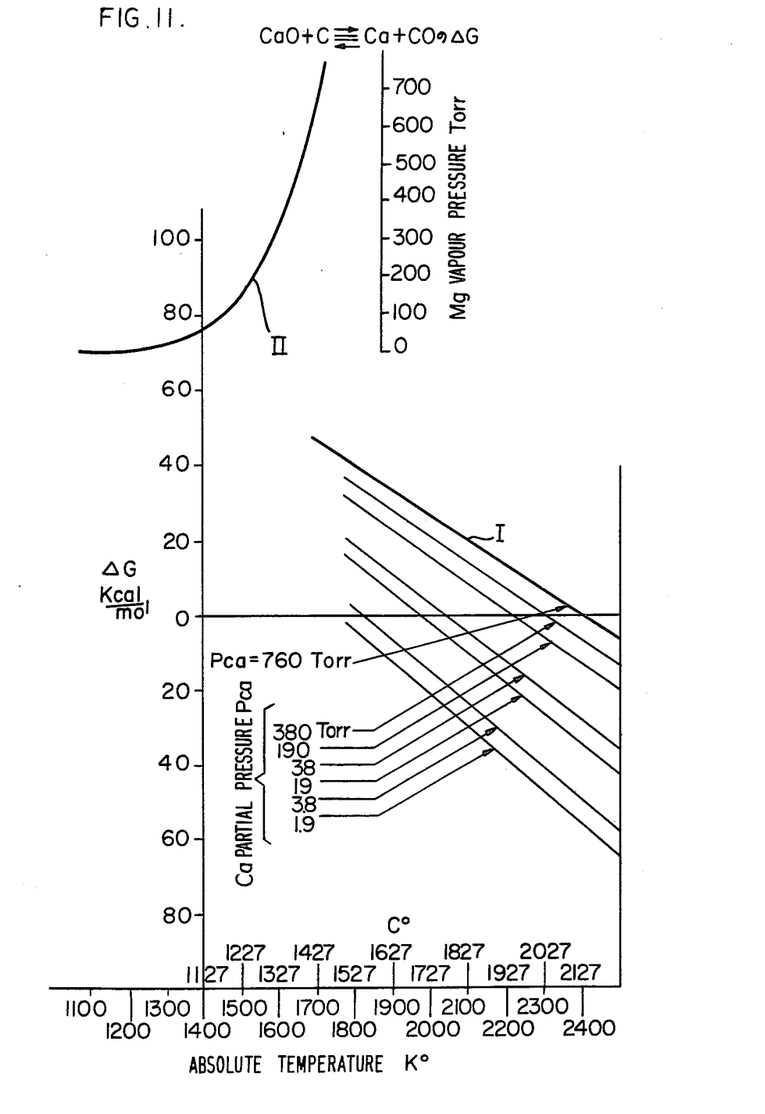
FIG. 11 is a chart showing changes in the free energy in formation of Ca.

CHARTS 10 and 11 show the free energy-temperature diagram of Mg and Ca in the formula (1) and the relationship between the vapour pressure-temperature diagram of Mg and Ca. In each chart the abscissa shows a temperature T° C. (T° K.), and the left-hand ordinate shows changes in the free energy in reaction ΔG Kcal/mol while the right-hand ordinate shows a vapour pressure of Mg (or Ca) Torr, and in the charts I shows the relationship between the free energy and temperature, and II shows the relationship between vapour pressure and temperature. ΔG shows the difference in free energy, and its value changes with a total pressure P (a partial pressure for Mg is ½ thereof), that is, when ΔG < 0, the reaction proceeds in the right-hand direction i.e., the reduction advances. In contrast, when ΔG > 0, the reaction occurs in the left-hand direction. When G = 0, the equilibrium will be reached.

For example, in TABLE 1, let the reaction chamber in which a carbon reduction of Mg oxides is performed have a pressure of one atmosphere, the equilibrium temperature will be 1793° C. If the reaction temperature in the reaction chamber is 1793° C., it will be required to decrease the internal pressure therein below one atmosphere e.g. by sucking the air by means of a vacuum pump. Thus the reaction proceeds in the right-hand direction, i.e., the reduction advances, thereby producing a mixed gas of Mg vapour and CO gas. Now, let the reaction chamber be operated at a pressure of 0.1 atm., the equilibrium temperature will be 1560° C. Accordingly, if the temperature of the mixed gas lowers below the equilibrium temperature of 1560° C., the reaction proceeds in the reverse direction in a very radical way, thereby causing the mixed gas to dissociate into MgO and C. As is evident from the example, when the mixed gas is produced at a pressure of one atmosphere and at a temperature of 1793° C. for obtaining Mg therefrom, it will be essential to cool the mixed gas instantaneously below a temperature at which the reverse reaction will never occur even if Mg and CO co-exist, e.g. about 200° C. In order to achieve it successfully, the mixed gas must be cooled at a far faster speed than that of the reverse reaction, i.e., each molecular motion speeds of Mg (or Ca) and CO. This means that the required spped should be supersonic, or numerically expressed, about $10^{6°}$ C./sec or more. The conventional methods adopting heat exchange with the use of a cooling medium will never satisfy this requirement, and fail to prevent the undesired reverse reaction. According to the present invention the need for using any cooling medium has been eliminated, and nevertheless the mixed gas can be safely led to the divergent nozzle under thermal control not to allow the reverse reaction to occur, and can expand adiabatically from the nozzle exit so as to ensure that the mixed gas is instantaneously cooled.

In general, when a gas is caused to expand adiabatically with the use of a nozzle, the enthalpy of the gas will be converted into a kinetic energy, and a reduction in pressure will cause a drop in temperature. This is a generally accepted fact, but when this theory is applied to the carbon reduction of Mg (or Ca) oxides, a special attention must be paid to the fact that Mg (or Ca) and CO co-existing in the mixed gas are radically reactive with each other, and in putting this theory into practice, a special care must be actually taken to prevent the reverse reaction especially when the mixed gas is unavoidably passed through the reverse reaction zone with those reversely reactive constituent gases in co-existence.

In the present invention, therefore, the mixed gas produced through the carbon reduction is led to the divergent nozzle, during which the mixed gas is kept at a temperature at which the reverse reaction is ineffective. As a result, the mixed gas is kept safe from the undesired reverse reaction until it reaches the up-stream section of the nozzle. This is essential for obtaining Mg or Ca in its highly pure form with a good productivity. In this case, the temperatures at which the reverse reaction is ineffective are shown in TABLES 1 and 2 referred to above. Under the known methods it happened that the mixed gas was subjected to the reverse reaction before reaching a point at which the heat exchange was expected to take place between the same and the cooling medium. In general, a speed at which the reverse reaction advances (i.e., its reactive urge) tends to increase in the reverse reaction zone thereof in proportion to a rise in temperature. The temperature at the up-stream section of the nozzle tends to be higher than that at the down-stream section, and the reverse reaction speed at the up-stream section is higher than that at the down-stream section. Once the reverse reaction occurs at the up-stream section, even if it is partial, solid MgO (or CaO) and C produced will never return to their original gaseous condition. In addition, MgO (or CaO) and C tend to precipitate in the nozzle, and are likely to cause a wearing damage in the inside wall thereof. However, in the present invention such troubles are effectively avoided, because the reverse reaction is prevented from occurring throughout the whole process of leading the mixed gas from the reaction chamber to to where its constituent gases are collected.

As described above, it is required to cool the mixed gas at an extremely high speed like $10^{6°}$ C./sec, which exceeds the molecular motion speeds of Mg (or Ca) and CO. This means that the mixed gas should be ejected through the nozzle at a supersonic speed. For example, let a mixed gas having a temperature of 1700° C. at the nozzle entry be cooled to about 200° C. at a point 1 meter distant from the nozzle entry, and let the average speed of the ejected gas be $X_M$ m/sec wherein the average speed is the mean value of the speed of the mixed gas at the nozzle entry and that at a point 1 meter distant from the nozzle entry, the latter speed being represented by X. Then the period of time for the gas to pass through the nozzle is:

$$\frac{1m}{X_M m/sec} = \frac{1}{X_M} \sec$$

The difference in temperature for this period of time is:

$$1700° C. - 200° C. = 1500° C.$$

Therefore, the cooling speed is:

$$\frac{1,500}{\frac{1}{X_M}} = 10^6 \; °C./sec$$

$$X_M = 666 m/S$$

From this it will be understood that X must be about 1330m/S even when the speed at the nozzle entry is nearly 0, and that the mixed gas should be caused to flow several times as fast as the speed of sound.

In view of this requirement of a supersonic speed a nozzle used in the present invention should be a De Laval nozzle consisting of a combination of a convergent section, a throat and a divergent section, or alternatively a divergent nozzle.

In general, in ensuring an adiabatic expansion of a gas through a divergent nozzle the enthalpy of the gas having a temperature of $T_o°$ K. at the nozzle entry is converted into a kinetic energy, thereby causing the gas to jet through the nozzle exit at a speed of $W_1$ as a supersonic stream while its temperature rapidly decreases to $T_1$. $T_1$ and $W_1$ are expressed by:

$$T_1 = \left(\frac{P_1}{P_0}\right)^{\frac{K-1}{K}} T_0 \quad (2)$$

$$W_1 = \phi \sqrt{R T_0} \quad (3)$$

$$\phi = \sqrt{2g \frac{K}{K-1} \left(1 - \left(\frac{P_1}{P_0}\right)^{\frac{K-1}{K}}\right)} \quad (4)$$

wherein:
$P_0$ = a pressure at the nozzle entry
$P_1$ = a pressure at the nozzle exit
$T_0$ = a temperature at the nozzle entry (° K.)
$T_1$ = a temperature at the nozzle exit (° K.)
$K = C_p/C_v$ ($C_p$: specific heat against a constant pressure, $C_v$: specific heat against a constant volume)
$g$ = acceleration due to gravity
$R$ = a constant depending upon the types of the gas
$W_1$ = speed at the nozzle $P_e$ = pressure outside the nozzle exit
$P_1 > P_e$: The nozzle operating under the condition of underexpansion
$P_1 = P_e$: The nozzle operating under the condition of optimum expansion
$P_1 < F_e$: The nozzle operating under the condition of overexpansion Therefore, it is desired that a nozzle to be used for the present invention is a divergent type, but if the nozzle is operated under the condition of overexpansion, an undesired peeling-off is likely to occur in the nozzle, and the flow of gas tends to be unstable. In addition a shock wave is likely to occur. Thus this condition is unsuitable for carrying out the present invention. Likewise, if the nozzle is operated under the condition of optimum expansion, this working condition is very liable to change in response to a slight change in the pressure and/or temperature in the reaction chamber. Especially, it is likely to shift to the condition of overexpansion if either pressure or temperature or both fall below the prescribed value. On the contrary, if the nozzle is operated under the condition of underexpansion, which means that the gas is in a potentially expansive state, the gas flows at a sonic speed at the throat of the nozzle, and accelerates towards the down-stream divergent section, where the speed becomes the supersonic speed $M_1$. From the nozzle exit the flow is further accelerated to become $M_2$ ($M_2 > M_1 > 1$), and abruptly expands outwardly.

As described above, the Mg (or Ca) and CO co-existing in the mixed gas are mutually very reactive, and therefore; (1) before the nozzle, the mixed gas is kept at a temperature at which the constituent gases cannot react with each other throughout the process from the reaction chamber up to the nozzle entry; (2) the flow of the mixed gas is accelerated to a required speed by the divergent nozzle operated under the condition of underexpansion in order to obtain a faster cooling speed that the speed of the reverse reaction; (3) by utilizing the tendency that the constituent gases having different ratios of specific heat deflect at their proper angle at the nozzle exit, when they are ejected through a divergent nozzle operated under underexpansion, the constituent gases are separated from each other to come out of contact, thereby preventing their reverse reaction. In the present invention it is essential to satisfy these requirements, and therefore, the nozzle to be used a divergent nozzle operated under the condition of underexpansion.

It is generally known that a cooling speed by heat exchange between a cooling medium and an object to be cooled depends upon the mean molecular speed of them, which is understood to be nearly equal to the speed of sound. Likewise, the chances for Mg (or Ca) and CO to come into contact with each other in the nozzle depends upon the mean molecular speed of them. Under the present invention, however, a divergent nozzle is operated under the condition of underexpansion so as to enable the mixed gas to expand adiabatically at a supersonic speed and to instantaneously cool the same to temperatures at which the reverse reaction is ineffective. This ensures a faster cooling speed than under the conventional heat exchange system. As will be apparent from the description, the inventor has demonstrated through repeated experiments that Mg and Ca can be obtained in their metallic, highly pure form by preventing the reverse reaction of Mg (or Ca) and CO with the use of a divergent nozzle operated under the condition of underexpansion.

Under the present invention a further advantage is obtainable from the use of a divergent nozzle operated under the condition of underexpansion that Mg (or Ca) and CO tend to deflect at their proper angle at the nozzle exit, wherein almost 100% of Mg (or Ca) exists with a small portion of CO within the deflection angle $\beta$ of Mg (or Ca) whereas outside the deflection angle $\beta$ 50% to 75% of CO exists with a negligible amount of Mg (or Ca) content. As a result, within the deflection angle the risk of causing the reverse reaction will be reduced because of the insufficient amount of CO, that is, 50% to 25% of its initial total amount. The fact that the constituent gases of a mixed gas tend to deflect at their proper angles at the nozzle exit has been discovered by the inventor, and it has been ascertained experimentally as well as theoretically. For example when a mixed gas of Ca and CO is ejected at a supersonic speed through the divergent nozzle in its potentially expansive state (i.e., under the condition of underexpansion), the mixed gas expands at the nozzle exit under the potentially expansive urge of each constituent gas, wherein CO tends to deflect at a larger angle than Ca. In this case the relative density of Ca is larger than that of CO at the nozzle exit. This means that a lighter CO tends to deflect at a larger angle than a heavier Ca. In the same way when a mixed gas of Mg and CO is ejected, CO tends to deflect at a larger angle than Mg. The relative density of CO is larger than that of Mg at the nozzle exit. Nevertheless, a heavier CO deflects at a larger angle than a lighter Mg. From these examples it can be concluded that the deflection angle is independent of the relative density, which cannot be explained by the accepted theory that a heavier object tends to position inside a lighter object. According to the discovery underlying the present invention, a gas tends to deflect at an angle depending upon its ratio of specific heat $C_p/C_v$ at the nozzle exit when it is ejected through the nozzle at a supersonic speed. This principle applies to when the gas is a mixed gas, wherein each constituent gas tends to deflect at its proper angle, separating from each other if their ratios of specific heat are different. In this case it has been found out that a gas having a smaller ratio of specific heat tends to deflect at a larger angle than otherwise. The present invention aims at utilizing this theory and phenomenon to obtain individual constituent gases having different ratios of specific heat, separated from their mixture by ejecting the same at a supersonic speed through a divergent nozzle operated under the condition of underexpansion. In general, the value K of ratio of specific heat is virtually constant depending upon the number of atoms of a gaseous molecule; e.g. a monoatomic gas has the K of about 1.67: a diatomic molecule gas has the K of about 1.40: a multi-atomic molecule gas has the K of no greater than 1.33, therein the multi-atomic gas means a gas having more than two atoms. Therefore, it is possible to separate a mixed gas into the constituent gases when it consists of a monoatomic gas and a diatomic molecule gas, or a monoatomic gas and a multi-atomic molecule gas, or a diatomic molecule gas and a multi-atomic molecule gas.

As the constituent gases individually expand from the nozzle exit and become distant therefrom, the density of their mixture will become thin, thereby reducing the possibility for the individual gases to come into contact with each other. It will be noted that the deflection angle $\beta_2$ of CO is larger than that ($\beta_1$) of Mg (or Ca), which means that it is easier to collect Mg (or Ca) from the mixture than to collect CO therefrom. In other words, since Mg (or Ca) stays within the deflection angle, it is easy not only to condense Mg (or Ca) in a collectable solid form, but also to secure the required high cooling speed like more than $10^{60}/S$.

The divergent nozzle can have various shapes of cross-sections, such as circular, elliptic, rectangular, polygonal, umbrella-shaped, or of irregular shape. For an industrial application a plurality of nozzles can be employed, instead of using a large nozzle which disadvantageously requires a relatively long time for the mixed gas to pass through. When a mixed gas of Mg and CO is ejected at a supersonic speed through the nozzle, the individual constituent gases tend to expand differently at the nozzle exit, during which their speeds accelerate and their temperatures rapidly fall below 200° C. at which Mg and CO cannot react with each other even if they co-exist. At this critical point a device can be located against the nozzle exit for condensing the gaseous Mg ejected therefrom to obtain the same in its powder form.

According to the present invention a mixed gas is subjected to a thermal control such that the constituent gases cannot react with each other, throughout the process from the reaction chamber up to the collecting place via the nozzle, thereby securing a high purity of the product and an increased productivity. A highly pure Mg and Ca obtained in this way are advantageously very fusible.

Under the known heat exchange system it is difficult to prevent the reverse reaction, where, before the heat exchange starts, the reverse reaction already occurs. For this reason the purity of the product is very low, such as 50% or 60% at maximum. An impure Mg and Ca are difficult to melt because of the presence of foreign substances if the latter occupies 10% or more. This is because the relative densities of Mg and Ca are very low with a slight difference with those of foreign substances, thereby staying in its paste form. Consequently, it is required to pelletize and re-distil the same, which means that a special extra process is needed. In addition it is likely that combustion is involved in this process. The Mg and Ca obtained by the present invention are readily melted without the need for any secondary process. This will be of particular advantage when they are applied to industrial purposes.

The invention will be more particularly described by way of example with reference to the drawing, in which:

FIG. 7 (a), (b) and (c) are respectively cross-sections of modified versions of the nozzle;

FIG. 8 (a) and (b) are respectively cross-sections of modified versions of the nozzle, wherein (b) is a further modification to (a);

FIG. 9 (a) and (b) are diagrammatic views showing a modified version of the apparatus in FIG. 4;

Figure 1:
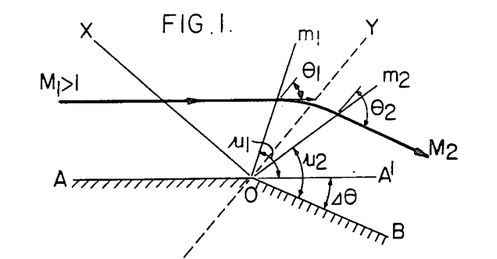
FIG. 1 is a chart showing the principle of an expansion flow around a solid corner at a supersonic speed.

In general, when a supersonic uniform jet stream flows along a convex surface like AOB as illustrated in FIG. 1, its speed and direction change so as to finally become a uniform stream along OB. Such a supersonic jet stream as to flow along a convex surface is known as a Prandtle-Meyer expansion stream.

In FIG. 1 the like OX is a Mach line corresponding to: $M = 1$, and when a line OY is drawn at right angle to the line OX, an angle $\theta$ is between the line OY and the stream flowing direction at any point on the stream line. $\theta$ will become the Mach number on that point, and the function of $$\lambda = \sqrt{\frac{K-1}{K+1}}$$

$$\theta = f(M,\lambda) = \frac{1}{\lambda} \tan^{-1}(\lambda \sqrt{M^2 - 1}) - \tan^{-1}\sqrt{M^2 - 1} \quad (5)$$

wherein:

$$\lambda = \sqrt{\frac{K-1}{K+1}}$$

$K = C_p/C_v$ M: the Mach number

Deflection angle $\Delta \theta = \theta_2 - \theta_1 = f(M_2, \lambda) - f(M_1, \lambda)$ (6)

Figure 2:
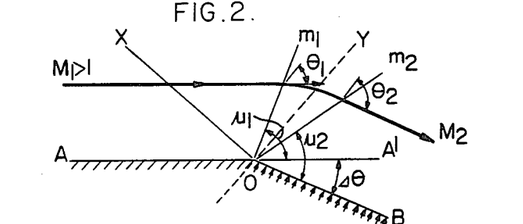
FIG. 2 is a chart showing the principle of an expansion flow around a pressure curtain replacing the solid wall in FIG. 1.

$M_2 > M_1 > 1$
$M_1$: The Mach number at the up-stream
$M_2$: The Mach number at the down-stream The wall OB can be replaced by a pressure curtain OB' as shown in FIG. 2, which is represented by the external pressure of the nozzle P. When the pressure at the nozzle entry is $P_0$ and the pressure at the nozzle exit is $P_1$, the following equations can be derived:

$$\frac{P}{P_0} = \left(\frac{2}{(K-1)M_2^2 + 2}\right)^{\frac{K}{K-1}} \quad (7)$$

$$\frac{P_1}{P_0} = \left(\frac{2}{(K-1)M_1^2 + 2}\right)^{\frac{K}{K-1}} \quad (8)$$

In general when a mixed gas is ejected at a supersonic speed through a nozzle, it will be possible to decide the amount of ejection and the speed and temperature at the nozzle exit from its attributive numbers if they are known. If a calculation is made on the assumption that each constituent gas should be singly ejected through the nozzle under the conditions of the same temperature at the nozzle entry as for the mixed gas, and of the attributive partial pressure of the mixed gas as the nozzle entry and exit, it will be understood that the total amount amount of ejection of each constituent gas is in accord with the amount of ejection of their mixture, and that the mean value of temperature and speed of each gas at the nozzle exit are respectively in accord with the values of temperature and speed of the mixture. Now let it be that the temperature at the nozzle entry is constant, the deflection angle $\Delta \theta$ of each constituent gas can be obtained by putting the values of its ratio of specific heat, and of its partial pressure in the equations (5), (6) and (7). This calculated angle means that the constituent gas will deflect at this angle if it is singly ejected under the conditions of the same temperature at the nozzle entry as for the mixed gas, and of the partial pressure thereof. In this case, $P_0$, $P_1$ and $P$ should be the values of partial pressure with respect to the constituent gases. Let it be now that there are two constituent gases $G_1$ and $G_2$ having ratios $K_1$ and $K_2$, and that each gas is singly ejected under the conditions specified above, i.e. at the same temperature at the nozzle entry as for the mixed gas and at the partial pressure thereof. Then their deflection angles $\Delta \theta_1$, and $\Delta \theta_2$ will be obtained, wherein each value corresponds to its ratio $K_1$ and $K_2$. If these gases are mixed and ejected at a supersonic speed through a divergent nozzle operated under the condition of underexpansion, at the constant temperature and at the total pressure (the sum of the partial pressure values with respect to the constituent gases), the constituent gases will deflect at angles $\Delta \theta_1$ and $\Delta \theta_2$ as if each gas were ejected singly through the nozzle.

Figure 3:
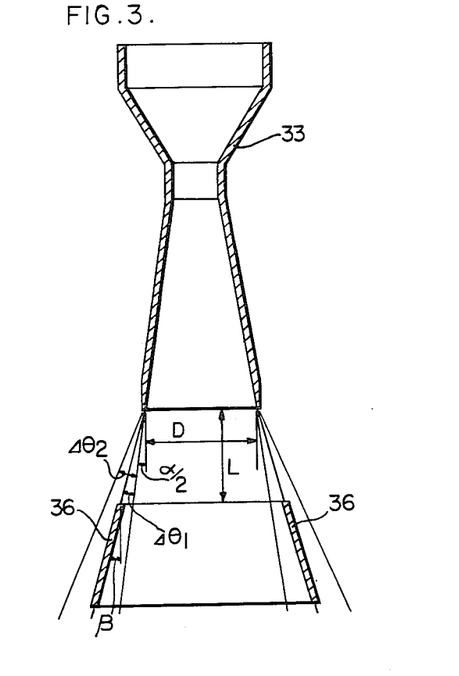
FIG. 3 is a diagrammatic view of a divergent nozzle operated under the condition of underexpansion and a separator screen located adjacent thereto.

As illustrated in FIG. 3, a separator screen 36 is located such that it is displaced angularly by $\Delta \theta_1$ outside from the extension X of the inside wall of the nozzle 33. This relationship is expressed by:

$$\beta \doteq \Delta \theta_1 + \alpha/2$$

wherein $\beta$ is the angle of the separator screen 36 to the axis of the nozzle, and $\alpha/2$ is the angle of the extension X of the nozzle inside wall to the axis of the nozzle. For simplifying the explanation this formula will be substituted by:

$$\beta = \Delta \theta_1 + \alpha/2$$

Now let it be that the constituent gases to be separated are $G_1$ and $G_2$, and that the deflection angles of each gas are $\Delta\theta_1$ and $\Delta\theta_2$, respectively ($\Delta\theta_2 > \Delta\theta_1$), and also let it be that the amount of $G_2$ outside the separator screen is $X_2 G_2$ ($X_2$: the proportion of $G_2$ outside the separator screen) while the amount of $G_1$ inside the screen is $X_1 G_1$ ($X_1$: the proportion of $G_1$ inside the screen). Then the following formulae are obtained:

The amount of $G_2$ outside the separator screen ... $X_2 G_2$

The amount of $G_1$ outside the separator screen ... 0

The amount of $G_2$ inside the separator screen ... $(1 - X_2) G_2$

The amount of $G_1$ inside the separator screen ... $G_1$

It is evident from these that the constituent gas $G_1$ is all present within the separator screen 36. This arrangement of the separator screen is suitable when it is desired that the gas $G_2$ is free from the $G_1$ content. In this case, $X_2$ depends upon the value of L/D, wherein L is the distance between the nozzle exit and the separator screen 36, and D is the inside diameter of the nozzle opening at its exit. An example of the relationship therebetween is numerically expressed as follows:

TABLE 4

| L/D | 0.5 | 1.0 | 1.5 | 1.8 7 | 2.0 |
|---|---|---|---|---|---|
| $X_2$ | 0.3 1 | 0.3 6 | 0.4 6 | 0.5 6 | 0.6 1 |

By this method the gas $G_2$ can be separated without having the $G_1$ content admixed therewith in a very efficient manner, which constitutes one of the advantages over the conventional methods.

The Mg and Ca obtained by the conventional methods have a deal of impurities, which makes it impossible to melt in the furnace as they are. It is therefore required to take out the Mg and Ca outside the furnace and re-distil them, during which the operation of the furnace must be stopped. However, in view of their combustible nature and handling of them is likely to constitute a life hazard, and in fact serious accidents have occurred. In order to avoid this danger one practice is to spray an oil over the product before taking it out, to kill its combustible potentiality. This extra procedure is troublesome, and expensive.

By the method according to the present invention the Mg and Ca can be put into the furnace as they are in their powder form or aggregate form, collected from the apparatus. In either case it is not required to take them out of the melting process, and therefore no danger is involved at all. Besides avoiding such handling dangers, the Mg and Ca obtained are highly pure.

Under the method according to the present invention the mixed gas ejected comes into collision with a collector surface on which Mg (or Ca) is collected in a powder form, the collector surface being constantly kept at a low temperature and shifted with respect to the nozzle exit so as to enable a fresh collecting surface to appear. This collecting means is located at a place where Mg (or Ca) and CO cannot react with each other. As described above, the mixed gas is caused to cool down to temperatures at which Mg (or Ca) and CO cannot react with each other, because of the adiabatic expansion. After the mixed gas has been ejected through the nozzle, the temperature of Mg (or Ca) continues to lower because of its own expansion and because of the cooling of it by the collecting surface, and gradually becomes a supercooled gas. Finally it condenses to become active particles. Immediately before coming into collision with the collecting means, Mg and Ca are either in a solid, powder form or in a mixture of a solid, powder form and a liquid, powder form. In any form Mr and Ca loses its kinetic energy in collision with the collector surface, and a part of the kinetic energy converts into heat, by which the Mg and Ca particles are softened. In this way Mg and Ca particles continue to add to the already softened particles on the collector surfaces, and finally they become a solidified state. In this case, care must be taken not to keep the angle of incidence of Mg (or Ca) to the collector surface at 45° or less, in which case Mg and Ca are likely to bounce on the collector surfaces and scatter in all directions, thereby failing to collect them. Otherwise, they are in danger of being sucked into the discharge line in the apparatus. This leads to the decreased productivity, and also a trouble is likely to occur in the discharge line. The heat imparted by the kinetic energy is cooled by the cooling means incorporated in the collector surface. However, as Mg and Ca accumulate on the surfaces, the cooling efficiency is decreased, and the cooling effect does not reach the top layer of Mg (or Ca) on the collector surfaces, on which the reverse reaction is likely to occur because of the increased temperature. Accordingly, care must be taken to avoid the build-up of Mg and Ca particles on the collector surfaces. Therefore, it is arranged that the collecting surfaces are constructed so as to be displaceable with respect to the nozzle exit, thereby enabling a fresh collecting surfaces to appear. In this case the collector surface can be continuously or intermittently shifted, and its shape can be flat, or round or spherical, or any others which can avoid causing a shock wave from the collision of Mg (or Ca) at right angle to the collector surface. The Mg and Ca particles collected on the collector surface are less combustible than those obtained by the conventional methods, and are not dangerous to handle. As described above, the Mg and Ca particles on the collector surface are softened due to the heat imparted by the kinetic energy, and this softened bed of Mg (or Ca) provides an acceptable base for the subsequent accumulation of Mg (or Ca) flown at a supersonic speed. Thus a solidified, elastic and amorphous layers of Mg and Ca are obtained. By virtue of the sticking nature of the softened bed of Mg and Ca already made, the scattering of Mg and Ca particles is prevented, thereby resulting in the increased productivity. If the degree of thickness of the Mg (or Ca) layer is to be controlled, the moving speed of the collector surface can be changed. Besides, the moving collector surface can avoid the undesired build-up of Mg and Ca particles thereon, thereby eliminating the danger of the reverse reaction possibly occurring due to the increased temperature. The solidified, elastic and amorphous layers are adapted to be cut to a desired length in a strip form.

According to the present invention a reaction chamber is provided, in which a Mg (or Ca) oxide is subjected to a carbon reduction at an elevated temperature to produce a mixed gas of Mg (or Ca), and the mixed gas is led through a thermal control means by which it is kept at temperatures at which Mg and CO (or Ca and CO) cannot react with each other, to a divergent nozzle operated under the condition of underexpansion through which the mixed gas is ejected at a supersonic speed so as to enable the same to expand adiabatically at a speed exceeding the molecular motion speed of Mg (or Ca) and CO, thereby causing the mixed gas to cool down instantaneously to temperatures at which Mg (or Ca) and CO cannot react with each other. Opposedly to the nozzle exit a collector means is provided so as to receive the jet of the mixed gas, on which Mg (or Ca) articles are collected in a powder form, wherein the collector means is movable with respect to the nozzle exit.

One of the advantages of the apparatus is that the process from the reaction chamber up to the collector means via the divergent nozzle is a single continuous line, and that throughout the process the mixed gas is kept at temperatures at which the constituent gases cannot react with each other, thereby obtaining Mg and Ca in their pure form with a high productivity.

It will be appreciated that the mixed gas is protected against the undesired reverse reaction, especially from the reaction chamber to the divergent nozzle, by providing a thermal control means consisting of a heater and a cooler, by which the equilibrium temperature or a higher temperature relative to the pressure in the duct in TABLES 1 and 2 is reached, thereby obviating the possibility of the reverse reaction at this most dangerous zone.

For a better understanding of the present invention an explanation will be given on this dangerous zone. Let the temperature in the reaction chamber be 1793° C., and the operation pressure be 0.1 atm., the equlibrium temperature will be 1560° C., and if the temperature of the mixed gas lowers below this temperature, the reverse reaction tends to occur radically. The mixed gas flows at a relatively slow speed in the duct from the reaction chamber to the nozzle, and even if the duct is short, it requires a relatively long time before the mixed gas passes through the duct, compared with its flowing speed in and after the divergent nozzle. Consequently, once the reverse reaction conditions have been satisfied, a great amount of constituent gases will be exhausted in the reverse reaction. As a result a great deal of MgO (or CaO) and C are produced in the system, and the efficiency of the divergent nozzle will be unrecoverably reduced. In addition, the nozzle is damaged or becomes worn out, and it will be impossible to obtain Mg and Ca in their pure form.

According to another aspect of the present invention a separator screen is provided at a place spaced from the nozzle exit and inside the maximum deflection angle of CO so as to lead a greater part of CO to pass outside the separator screen. Thus Mg (or Ca) and a small part of CO are gathered inside the separator screen, and are caused to come into collision with the collector surfaces as described above.

By this separator screen a mixed gas consisting of gases having different ratios of specific heat can be efficiently separated into the constituent gases. In addition the supersonic speed can be utilized, and the separation speed is considerably high. The separating means is simplified in construction. It can be made of heat-proof material, so that a high temperature mixed gas can be handled. A further advantage is that constituent gases can be effectively separated from each other before the undesired reverse reaction occurs. Under the method and apparatus of the present invention the instantaneous cooling is effected, in addition to the mechanical separation of the constituent gases by the separator screen. Thus the reverse reaction can be perfectly prevented.

Figure 4:
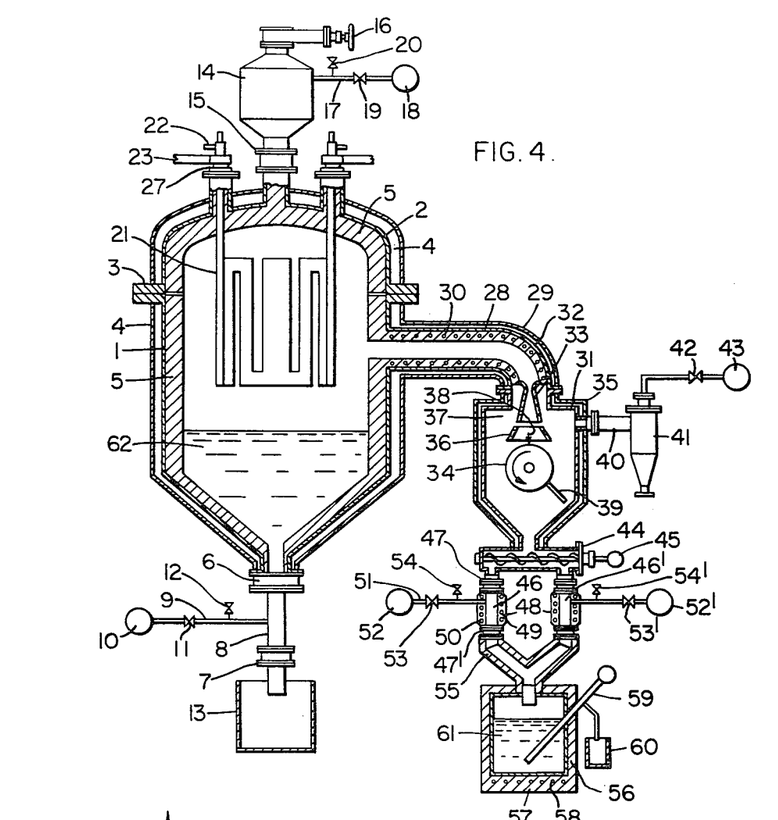
FIG. 4 is a vertical cross-section through the entire structure of an apparatus for use in carrying out the method according to the present invention.

Referring to FIG. 4, a reaction chamber 1 is covered by a cover 2, both being made anti-pressure, anti-vacuum and air-tight, wherein the cover is surrounded by a cooling water jacket 4. The chamber and the cover are partitioned by thermal insulating refractories 5. The bottom portion of the chamber 1 is shaped such that the accumulating residues can be readily taken away; in the illustrated apparatus it is conical. Under the bottom discharge ports 6 and 7, and a reservoir 8 are provided. The reservoir 8 is communicated with a vacuum pump 10 by way of a duct 9 for producing a vacuum therein. The duct 9 is provided with an anti-vacuum valve 11 and a valve 12, and a receptacle 13 is provided under the reservoir 8 for the residues. On the cover 2 a tank 14 is provided for containing a material, wherein the tank is provided with a lower valve 15 and an upper valve 16. The tank is communicated with a vacuum pump 18 by way of a pipe 17, so as to produce a vacuum therein. The pipe 17 is provided with an anti-vacuum valve 19 and a valve 20. The material is supplied into the reaction chamber 1 from the tank 14. The reaction chamber 1 is provided with a pair of electrodes, between which a resistor heater 21 of a graphite plate is supported by means of screw means.

Figure 5:
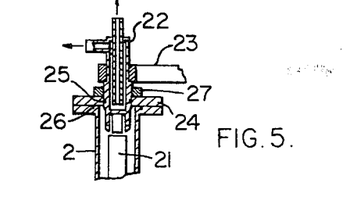
FIG. 5 is a sectional vertical cross-section on a larger scale of portion of the apparatus in FIG. 4.

The material 62 in the chamber 1 is heated and vapourized by the heater 21. The electrodes are secured to the cover 2 by fastening means 22 supported by bus-bars 23. As best illustrated in FIG. 5, the fastening means 22 is secured to a flange 24 by a nut 27 with a packing 25 interposed. In this way the flange 24 is secured to the cover 2 with a packing 26. This section of structure is also anti-vacuum and anti-pressure. Alternatively, an arc heating system can be employed for heating the material.

From the reaction chamber 1 a duct 28 is extended for passing the mixed gas through, which is also surrounded by a cooling water jacket 29 and which is lined with thermal insulating refractories 32. The duct is communicated with a chamber 31 in which the mixed gas is separated into the constituent gases. Inside the refractories 32 a resistor heater 30 is embedded so as to keep the internal temperature of the duct 28 at a temperature at which the reverse reaction is ineffective, wherein the heater is controlled through a control circuit (not shown). The top end of the duct 28 is connected to a nozzle 33 whose divergent opening is directed towards the inside of the chamber 31.

The chamber 31 is surrounded by a cooling water jacket 35. A collector 34 is provided opposedly to the nozzle 33, with a suitable cooling means (not shown) therein. The surface of the collector 34 is cylindrical, but the shape is not restricted to it, and can be flat, arch-like, spherical. In the illustrated embodiment the cylindrical collector is horizontally and rotatatively supported under the nozzle exit, driven by a motor (not shown), and also its body is reciprocally shifted perpendicularly to the paper of the drawing, i.e., at right angle to the axis of the nozzle. The movement of the collector can be intermittent or continuous. Between the nozzle 33 and the collector 34 there is provided a separator screen 36. Outside the separator screen a part of the CO gas having no Mg content tends to pass as a flow 37, whereas inside the separator screen Mg and CO tend to pass in a mixture as a flow 38, which comes into collision with the cylindrical surface of the collector. The remaining CO gas flows through gaps between the separator screen 36 and the collector 34. The Mg particles on the collector 34 are removed by a scraper 39, and fall onto the bottom of the chamber 31. The chamber 31 is provided with a pipe 40 in the side wall thereof, the pipe being connected to a cyclone 41 and a vacuum pump 43 via a vacuum valve 42.

Under the chamber 31 a screw conveyor 44 driven by a motor 45 in the clockwise or anti-clockwise direction is provided to transport and distribute the fallen Mg particles. At opposite end portions of the conveyor 44 ducts 46 are provided for collecting the Mg particles. The duct is provided with a pair of valves 47 and 47', and is also provided with a furnace 48 for melting the Mg particles, the furnace being surrounded by a refractory 49 and a heater 50 and also being provided with a pipe 51 connected to a vacuum pump 52. The pipe 51 is provided with a vacuum valve 53 and a valve 54.

The duct 46 is communicated with a collecting tank 56 through a secondary duct 55 of heat-proof nature. The collecting tank 56 is surrounded by a heat-proof wall 57, and is provided with a heater 58 at the bottom thereof. The molten Mg 61 is sucked by a pump 59, and is received by a receptacle 60.

The function of the vacuum pump 43 is to operate the divergent nozzle under the condition of underexpansion, to suck the whole amount of CO gas, and to reduce the internal pressure in the reaction chamber 1. When the material is supplied in the material tank 14, valves 15, 19 and 20 are closed whereas the valve 16 is opened. After the material is charged, the material tank 14 is evacuated by the vacuum pump 18, wherein the valve 16 is closed and the valve 19 is opened. In producing a vacuum in the tank the valve 16 is closed and the valve 19 is opened. Then with the valve 19 being closed and the valve 20 being opened, an inert gas is introduced through the valve 20 to the extent at which the pressures in the tank 14 and the reaction chamber 1 are balanced. At this stage the valve 15 is opened so as to to enable the material in the tank 14 to drop into the reaction chamber 1. Then with the valve 15 being closed and the valve 20 being opened, air is introduced through the valve 20. The cycle is completed by opening the valve 16 and closing the valve 20. The vacuum pump 10 for the residue take-out reservoir 8 is to produce a vacuum therein with the valves 6, 7 and 12 being closed and the valve 11 being opened. Then an inert gas is introduced through the valve 12 into the reservoir with the valve 11 being closed, thereby balancing the pressures in the reservoir and the reaction chamber. Then the residue is dropped into the reservoir with the valve 12 being closed and the valve 6 being opened. Then the valve 6 is closed, and an inert gas is introduced through the valve 12 to attain atmospheric pressure. Subsequently, the valve 12 is closed, and the valve 7 is opened, thereby enabling the residue to drop into the receptacle 13. The cycle is completed by closing the valve 7. The vacuum pump 52 for the melting furnace is to produce a vacuum therein. With the valves 47', 54, and 53 being closed, and the valve 47 being opened, the Mg particles are caused to drop into the melting furnace 48 from the conveyor 44, and then the valve 47 is closed to introduce an inert gas into the furnace through the valve 54 until atmospheric pressure is attained therein. With the valve 54 being closed the Mg particles are melted by the heater 50, and the molten Mg is led to the reservoir 56 through the valve 47 opened. Then with the valve 47' being closed and the valve 53 being opened the melting furnace 48 is evacuated by the pump 52. Again an inert gas is introduced therein through the valve 54 opened with the valve 53 being closed, until the pressures in the furnace 48 and the conveyor 44 reach the equilibrium. The cycle is completed by closing the valve 54 and opening the valve 47. The melting furnaces are provided in pair so as to operate them alternately, wherein the conveyor 44 is rotated by the motor 45 in the clockwise or anti-clockwise direction. In this way the pump 43 is continuously operated whereas the pumps 18, 10 and 52 are operated with breaks when required.

A typical example of the operation will be explained: MgO or a material containing the same is supplied with the addition of a theoretical equivalent weight of C or a slightly excessive amount of C, wherein they are mixed in briquette. The inside wall of the reaction chamber 1 is kept at 1600° C. to 1900° C. It is preferred that at the initial stage an appropriate amount of the material is placed on the gate valve 6 to protect the same against the heat, but as the operation advances, the reaction products accumulate on it and do the protecting role in place of the material. A given amount of material in briquette is firstly supplied in the tank 14 with the valve 15 being closed and the valve 16 being opened. Then with the valve 16 being closed, the valve 19 being opened, and the valve 20 being closed, a vacuum is produced in the tank 14 by the pump 18. In this case, after a vacuum is produced, an inert gas can be introduced through the valve 20. The material in the tank 14 is then dropped into the reaction chamber through the gate valve 15 opened, and is heated at its bottom by the heater 21. When the briquette is heated to its reacting temperature, a mixed gas of Mg and CO is generated in the upper section of the chamber, which is led to the divergent nozzle 33 through the duct 28 under the thermal control. With this mixed gas the nozzle 33 is operated under the condition of its underexpansion, whereby the mixed gas is ejected through the nozzle exit at a supersonic speed towards the collector 34. The ejected mixed gas is separated into Mg and CO gases, wherein the CO gas partially deflects outside the separator screen 36 whereas the rest of CO gas and the whole amount of Mg gas are led inside the screen and come into abutment with the collector 34. During the ejection the mixed gas adiabatically expands and reaches several times the speed of sound, while its temperature abruptly drops to a temperature at which Mg and CO do not react with each other even if they co-exits, i.e., at about 200° C. or less. During this cooling process the Mg becomes a supercooled vapour, and part of it begins to condense, which collides in a powder form with the collector 34. The kinetic energy possessed by the Mg powder loses thereon and converts into heat by which the layer on the collector 34 is softened, thereby enabling the freshly accumulating Mg particles to stick thereon. The collector 34 is cooled by a suitable means and the heat transmitted from the Mg particles is absorbed. As the collector 34 is rotated as described above, the particles thereon are removed by means of the scraper 39, and are enabled to drop onto the conveyor 44. The CO deviating to outside the separator screen is discharged outside by the vacuum pump 43 via the the pipe 40 and the cyclone 41. The particles on the conveyor 44 are introduced into either of the furnaces 48, wherein the valve 47 is opened while the valve 47' is closed. When a given amount of Mg particles is supplied therein, an inert gas, such as Ar, is introduced through the valve 54 with the valve 47 being closed. Then the particles are melted by the heater 50. The melting point of Mg is 650° C., but in this case they are preferably heated to 680° C., so that a sufficient fluidity is obtained. The molten Mg is flown out through the gate valve 47' and is stored in the reservoir 56. Then, with the valve 47' and the valve 54 being closed, the Ar in the reservoir 48 is evacuated by the pump 52. This cycle is completed by closing the valve 53 and opening the valve 47, and the same procedure is subsequently repeated. The reason for sending an inert gas to the furnace is to control a relatively large vapour pressure of Mg. In this way when the furnace is filled with the Mg particles, the conveyor 44 is reversely rotated to charge the other furnace 48 with the same, during which the particles in the first furnace are melted. The capacity of the furnace is determined such that the alternate operations are possible without breaks. The molten product 61 in the reservoir is heated by heaters 58 embedded in the bottom 57, which is helped by the inside wall made of an insulating material so as to keep the internal temperature constant. When the reservoir is filled with the molten Mg it is covered by an inert gas above its level. The molten Mg therein is pumped by the pump 59 and received by the receptacle 60. In this case, care must be taken not to expose the molten product directly to the atmosphere, for which it is proposed that the top of the suction pipe is covered with a suitable flux. Instead of using the receptacle 60 the exhaust port of the pump 59 can be directly connected to a casting machine.

It will be appreciated that the simplicity with which the Mg is melted in the furnace is due to its high purity secured by the present invention.

In order to effect the continuous operation of the apparatus, a material is intermittently supplied into the reaction chamber 1, but this invites the problem of a continuous pile-up of residue. To remove it the valve 11 is closed and the gate valve 6 is opened, thereby enabling it to drop into the take-out reservoir 8, wherein the reservoir is kept at a vacuum with the valve 7 being closed. Then with the valve 6 being closed an inert gas like Ar is introduced through the valve 12, and subsequently the valve 7 is opened, thereby enabling the residue to drop into the receptable 13. Finally the valve 7 is closed and the valve 11 is opened, and a vacuum is again produced in the reservoir 8 by the pump 10. The same procedure is repeated to remove the residue.

Figure 6:
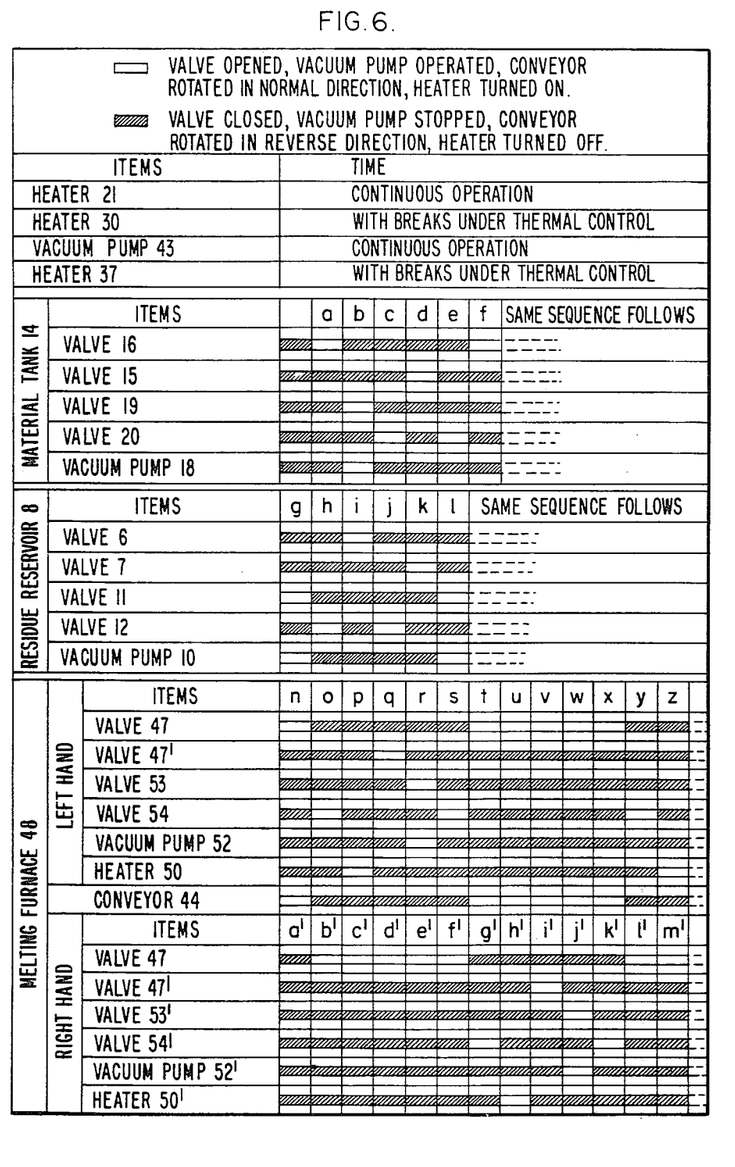
FIG. 6 is a timing diagram illustrating the sequence of operation of the heater, the pump and the valves in the apparatus in FIG. 4.
Figure 6A:
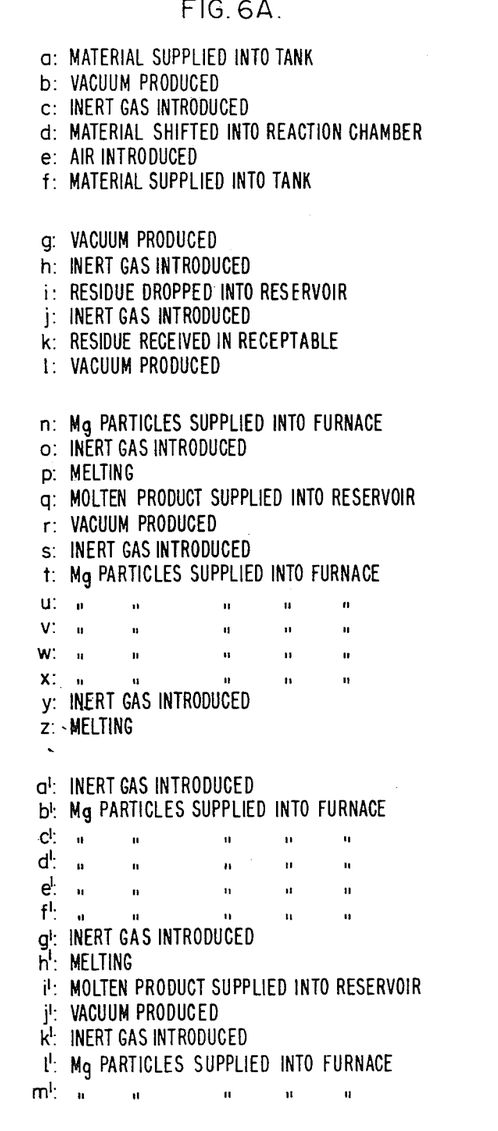

FIG. 6 shown a timing diagram illustrating the sequence of operation of the heaters 21, 30, 58, 50: pumps 10, 18, 43, 52, 52', and valves 6, 7, 11, 12, 16, 15, 19, 20, 47', 47, 53, 54, 53' 54', and the screw conveyor 44.

In the embodiments referred to above a single divergent nozzle is employed, but a plurality of divergent nozzles can be used if they are operated under the condition of underexpansion as mentioned above. In addition, in the illustrated apparatus a separator screen is employed, but the collector 34 can be faced directly to the nozzle without the interposition of the separator screen, wherein it is also preferred that the collector is movable with respect to the nozzle. Mg (or Ca) particles directly come into collision with the surface of the collector on which they stay in an aggregate form.

The features and advantages of the present invention will be better understood by the following examples, wherein TABLE 5 relates to Mg and TABLE 6 relates to Ca:

TABLE 5

| Mg | TEST NO. 1 | TEST NO. 2 |
|---|---|---|
| Temperature in the reaction chamber ($T_0°$ C.) | 1927 | 1727 |
| Total pressure in the same ($P_0$ Torr) | 69.7 | 139 |
| Expansion ratio of the nozzle employed: $\frac{1}{X} = \frac{P_0}{P_1}$ | 7.5 | 12.5 |
| Temperature at the nozzle exit ($T_1°$ C.) | 851 | 588 |
| Total pressure at the nozzle exit ($P_1$ Torr) | 9.3 | 11.1 |
| Pressure in the collecting chamber (P Torr) | 0.14 | 0.28 |
| $P/P_0$ | 1/500 | 1/500 |
| The Mach number at the nozzle exit ($M_1$) | 1.957 | 2.298 |
| The Mach number above the collector ($M_2$) | 5.267 | 5.267 |
| The material (weight) | MgO:0.774Kg C:0.23Kg | MgO:0.774Kg C:0.24Kg |
| The material (mesh) | both: −150mesh | both: −200mesh |
| The collected amount of Mg (Kg) (Theoretical amount) | 0.448Kg (0.467Kg) | 0.444Kg (0.467Kg) |
| Quality and productivity | Mg:99%up C:0.3% $\eta$=0.959 | Mg:99%up C:0.2% $\eta$=0.951 |
| The amount of Mg caught by the cyclone | 0.003Kg | 0.004Kg |
| Quality and productivity | Mg:95% MgO:4% C:0.5% $\eta$=0.006 | Mg:97% MgO:2% C:0.5% $\eta$=0.009 |
| The amount of residues (The percentage to the initial total amount) | 0.032Kg (3.2%) | 0.041Kg (4.0%) |

TABLE 6

| Ca | TEST NO. 1 |
|---|---|
| Temperature in the reaction chamber ($T_0°$ C.) | 2027 |
| Total pressure in the same ($P_0$ Torr) | 3.8 |
| Expansion ratio of the nozzle employed: $\frac{1}{X} = \frac{P_0}{P_1}$ | 7.5 |
| Temperature at the nozzle exit ($T_1°$ C.) | 902 |
| Total pressure at the nozzle exit ($P_1$ Torr) | 0.5 (a partial pressure:0.25Torr) |
| Pressure in the collecting chamber (P Torr) | 0.0075 |
| $P/P_0$ | 1/500 |
| The Mach number at the nozzle exit ($M_1$) | 1.957 |
| The Mach number above the collector ($M_2$) | 5.267 |

TABLE 6-continued

| Ca | TEST NO. 1 |
|---|---|
| The material (weight) | CaO:0.561 C:0.120 |
| The material (mesh) | Both: −200mesh |
| The collected amount of Mg (Kg) | 0.268Kg |
| (Theoretical amount) | (0.280Kg) |
| Quality and productivity | Ca:99%up C:0.2% =0.957 |
| The amount of Mg caught by the cyclone | 0.002Kg |
| Quality and productivity | Ca:94% CaO:5% C:0.5% =0.008 |
| The amount of residues (The percentage to the initial total amont) | 0.024Kg (3.5%) |

TABLES 7 and 8 show the results of analysis with respect to the Mg and Ca obtained in the described manner:

TABLE 7

(Mg)

| Al | Mn | Si | Cu | Fe | Ni | Zn | Mg |
|---|---|---|---|---|---|---|---|
| 0.006% | 0.003% | 0.005% | 0.0004% | 0.002% | 0.0005% | 0.015% | 99.968% |

TABLE 8

(Ca)

| Fe | Mn | Si | Ni | Cr | Mg |
|---|---|---|---|---|---|
| 0.038% | 0.015% | 0.008% | 0.008% | 0.005% | 0.010% |

| Na | C | N | O | Ca |
|---|---|---|---|---|
| (*) | 0.005% | 0.058% | 0.012% | 99.84% |

(*)A negligible amount

TABLES 9 and 10 show an example of the separation characteristics of the separator screen with respect to Mg and Ca, respectively:

TABLE 9

| | TEST NO. 1 | TEST NO. 2 |
|---|---|---|
| Temperature at nozzle entry ($T_0°$ C.) | 1927 | 1727 |
| Total pressure at nozzle entry ($P_0$ Torr) | 69.7 | 139 |
| Expansion ratio of the nozzle employed: $\frac{1}{X} = \frac{P_0}{P_1}$ | 7.5 | 12.5 |
| Temperature at nozzle exit ($T_1°$ C.) | 851 | 588 |
| Total pressure at nozzle exit ($P_1$ Torr) | 9.3 | 11.1 |
| External pressure at nozzle exit (P Torr) | 0.14 | 0.28 |
| $P/P_0$ | 1/500 | 1/500 |
| Deflection angle $\Delta\theta_1$ at Mg side | 40.9° | $\Delta\theta_1 = 33.5°$ $\Delta\theta'_1 = 19.5°$ |
| Deflection angle $\Delta\theta_2$ at CO side | 52.7° | 42.2° |
| Angle $\beta$ of the separator screen | 48.9° | 27.5° |
| L/D | 1.5 | 2.1 |
| Gas outside the separator screen (Wt.%) | CO: 53.5 Mg: 0 approx. | CO: 73.6 Mg: 0 approx. |
| Gas inside the separator screen (Wt.%) | CO: 46.5 Mg: 100 approx. | CO: 26.4 Mg: 100 approx. |
| The Mach number of CO | $M_1$: 1.97 $M_2$: 4.95 | $M_1$: 2.30 $M_2$: 4.95 |
| The Mach number of Mg | $M_1$: 1.93 $M_2$: 5.75 | $M_1$: 2.29 $M_2$: 5.75 |

TABLE 10

| | TEST NO. 1 | TEST NO. 2 |
|---|---|---|
| Temperature at nozzle entry ($T_0°$ C.) | 2027 | 1927 |
| Total pressure at nozzle entry ($P_0$ Torr) | 7.5 | 93.8 |
| Expansion ratio of the nozzle employed: $\frac{1}{X} = \frac{P_0}{P_1}$ | 7.5 | 12.5 |
| Temperature at nozzle exit ($T_1°$ C.) | 902 | 675 |
| Total pressure at nozzle exit ($P_1$ Torr) | 1 | 7.5 |
| Partial pressure for Ca | (0.5 Torr) | (3.75 Torr) |
| External pressure at nozzzle exit (P Torr) | 0.015 | 0.188 |
| $P/P_0$ | 1/500 | 1/500 |
| Deflection angle $\Delta\theta$ at Ca side | 40.9° | $\Delta\theta_1 = 33.5°$ $\Delta\theta_1' = 23°$ |
| Deflection angle $\Delta\theta_2$ at CO side | 52.7° | 42.2° |
| Angle $\beta$ of the separator screen | 48.9° | 31° |
| L/D | 1.5 | 1.75 |
| Gas outside the separator screen (Wt.%) | CO: 54.6 Ca: 0 | CO: 65.3 Ca: 0 |
| Gas inside the separator screen (Wt.%) | CO: 45.4 Ca: 100 | CO: 34.7 Ca: 100 |
| The Mach number of CO | $M_1$: 1.97 $M_2$: 4.95 | $M_1$: 2.30 $M_2$: 4.95 |
| The Mach number of Ca | $M_1$: 1.93 $M_2$: 5.75 | $M_1$: 2.29 $M_2$: 5.75 |

TABLE 11 shows the difference in the deflection angles $\Delta\theta$, and $\Delta\theta_2$ between Ca and CO, in terms of figures obtained by measurement and calculation, on the basis of the experiment carried out for obtaining the data in TABLE 10:

TABLE 11

| (Times) | (Actual Measurements) | | | | | mean fig. | (Calculation) |
|---|---|---|---|---|---|---|---|
| | 1st | 2nd | 3rd | 4th | 5th | | |
| $\Delta\theta_1$(Ca): | 41.8 | 40.4 | 39.9 | 42.1 | 40.4 | 40.92° | 40.89° |
| $\Delta\theta_2$(CO): | 52.2 | 53.6 | 52.0 | 52.5 | 53.4 | 52.74° | 52.70° |

As is evident from this table, no substantial difference exists between the measurement and the calculation, and it will be understood that the separator screen can be located at its optimum position by a previous calculation of the deflection angle of the gas to be obtained.

Figure 7:
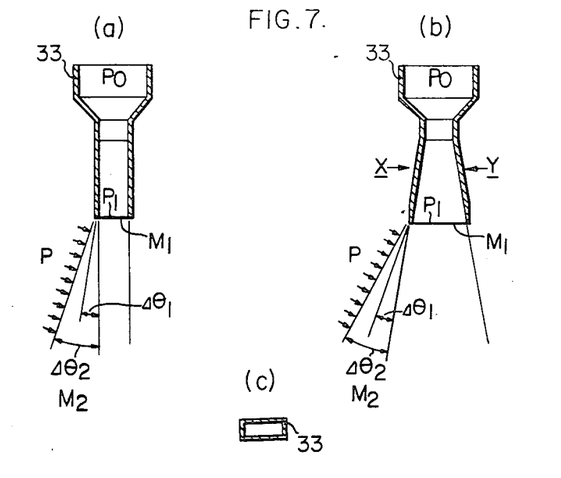
Figure 8:
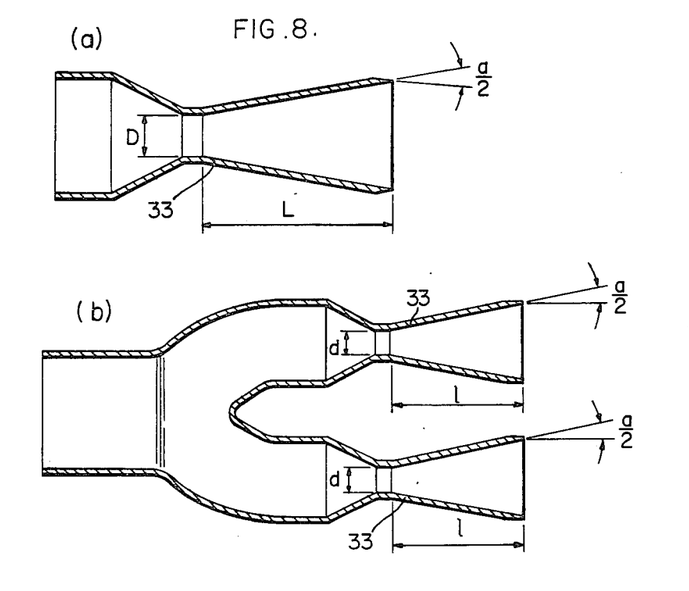

In the present invention, it is essential to cause each constituent gas to deflect at its proper angle $\Delta\theta$ at the nozzle exit, through which the mixed gas is ejected at a supersonic speed. In order to achieve it, the nozzle must be a divergent nozzle operable under the condition of underexpansion, as is evident from the equations (5) and (6); its typical example is illustrated in FIG. 3. However, its cross-section can be various, such as circular, elliptic, triangular, rectangular, polygonal. When the cross-section is rectangular, it is also possible that either of the two pairs of side walls are in parallel with the nozzle axis while the other pair of side walls are apart therefrom towards the nozzle exit. This modified version is illustrated in FIG. 7 (a), (b), (c). If the divergent nozzle is operated under the condition of optimum expansion or overexpansion, it cannot be employed. In this specification a divergent nozzle includes a umbrella-like divergent nozzle. The embodiments illustrated in FIG. 8 have an exit angle of $\alpha/2$, but the nozzle in (b) consists of two nozzles having the same performance as the nozzle in (a). Here, let the diameter of the throat in (a) be D, and the length of the divergent portion be L. For the nozzle in (b), let the diameter of the throat be d, and the length of the divergent portion be l $$d = \frac{D}{\sqrt{2}}, \quad l = \frac{L}{\sqrt{2}} < L \tag{10}$$

From these equations it will be understood that the length of l can be shortened.

Figure 9:
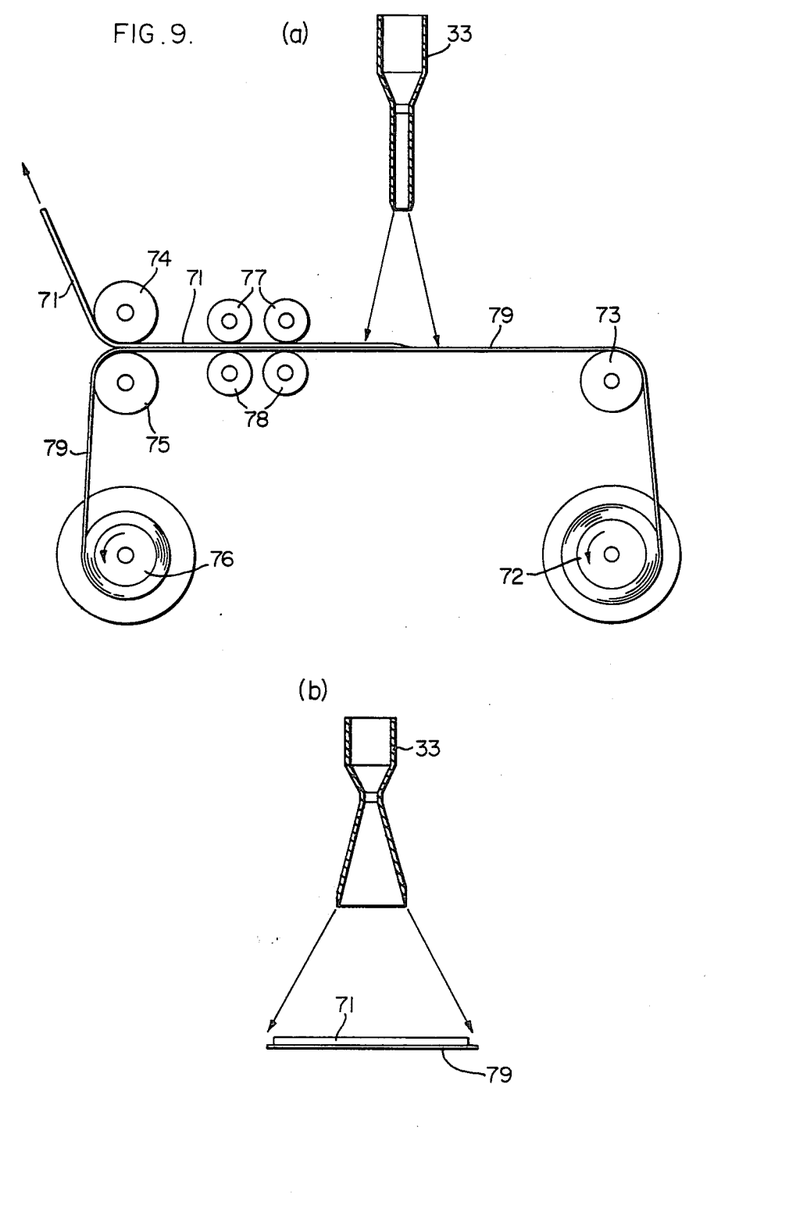

FIG. 9 illustrates a modified version of the embodiment shown in FIG. 4, in which the collector 34, the melting furnace 48 and the molten product reservoir 56 are replaced by a strip 79 for receiving the gas jets. The nozzle 33 is the same type as that in FIG. 7. The strip is located at a required distance from the nozzle exit, such that the strip can run in either direction by means of rollers. In the illustrated embodiment the strip 79 is caused to run from a reel 72 up to a further reel 76 by means of driving rollers 73 and 75 via pressing rollers 77 and 78. The Mg particles ejected at a supersonic speed through the nozzle 33 come into collision with the strip 79 and stay in a solid, powder form thereon. On the strip 79 they are oppressed by the rollers 77 and 78 to form a band 71, which separates from the strip 79 from a roller 74 for being wound up a reel (not shown). The band of Mg obtained in this way was about 0.8mm thick, safe from oxidation, and was very elastic and smooth in surface.

As a further preferred embodiment it is also possible that a thin iron sheet or any other sheet is employed for the strip 79, and that the strip is wound up on the reel 76 together with the adhering Mg. This band can be cut to a desired length and wound up on a desired number of reels for a desulphurizing Mg strip. Such desulphurizing Mg strips are very effective to remove sulphur because of its high purity free from an undesired oxidation film on the surface. By changing the thickness of the Mg layer the relative density required for a desulphurizing agent can be appropriately controlled. It is in an amorphous, corrugated state, and has no danger of combustion. In addition, it can be readily rolled up or folded into a desired form.

The strip 79 can be made of steel, stainless steel, copper, brass, or the like. They are selected in accordance with the uses, and also they can be kept in stock for future uses, wherein they are kept in a container filled with an inert gas as in its rolled form or folded form or any others. Because of the existence of the inert gas they can be preserved for a long time.

Various other modifications can be made without departing from the scope of the invention. In addition, Be, Sr, Ba and other equivalents to Mg and Ca can be obtained by the method according to the present invention.

What I claim is:

1. A method of obtaining a metal selected from the group consisting of Mg, Be, Sr, Ba and Ca through a carbon reduction of their oxides at elevated temperatures, which comprises:
   (a) introducing a mixed gas consisting of said metal and CO produced from said carbon reduction into a divergent nozzle operated under the condition of underexpansion, under thermal control not to allow said constituent gases to react with each other;
   (b) ejecting said mixed gas through said divergent nozzle, and enabling said mixed gas to adiabatically expand at a speed exceeding the molecular motion speeds of said constituent gases, thereby causing said mixed gas to cool down instantaneously to temperatures at which said constituent gases cannot react with each other;
   (c) separating said mixed gas into said metal and CO and collecting said metal.

2. A method as claimed in claim 1, wherein the ejection of said mixed gas through said divergent nozzle is directed to a separator screen located spacedly from said nozzle exit and within the maximum deflection angle of said CO, thereby enabling a greater part of said CO to pass outside said separator screen and enabling said metal and a small portion of said CO to gather within said separator screen.

3. A method of obtaining a metal selected from the group consisting of Be, Sr, Ba, Mg and Ca through a carbon reduction of their oxides at elevated temperatures, which comprises:
   (a) introducing a mixed gas consisting of said metal and CO produced from said carbon reduction into a divergent nozzle operated under the condition of underexpansion, under thermal control not to allow said constituent gases to react with each other;
   (b) ejecting said mixed gas through said divergent nozzle, and enabling said mixed gas to adiabatically expand at a speed exceeding the molecular motion speeds of said constituent gases, thereby causing said mixed gas to cool down instantaneously to temperatures at which said constituent gases cannot react with each other;
   (c) separating said mixed gas into said metal and CO to collect said metal;
   (d) placing said metal in a melting furnace to obtain the same in its molten form.

4. A method as claimed in claim 1, wherein the ejection of said mixed gas through said divergent nozzle is directed to a collecting means whose collector surface is movable with respect to said nozzle exit, thereby collecting said metal thereon in its aggregate, powder form.

5. A method as claimed in claim 4, wherein the collected metal on the collector is solidified into a strip form thereon; said metal strip being moved away from said nozzle together with said collector surface for separating the metal from said collector surface.

* * * * *